United States Patent [19]
Kearney et al.

[11] Patent Number: 5,631,602
[45] Date of Patent: May 20, 1997

[54] WHEATSTONE BRIDGE AMPLIFIER CIRCUIT WITH INTEGRATED DIAGNOSTIC TESTING

[75] Inventors: Mark B. Kearney; Robert H. Obremski, both of Kokomo, Ind.

[73] Assignee: Delco Electronics Corporation, Kokomo, Ind.

[21] Appl. No.: 511,769

[22] Filed: Aug. 7, 1995

[51] Int. Cl.$^6$ .................... H03F 3/00; G01L 1/20
[52] U.S. Cl. .................... 330/2; 73/1.38; 73/1.88; 330/146
[58] Field of Search .................... 330/2, 146; 73/1 B, 73/1 C, 1 D, 1 DV

[56] References Cited

U.S. PATENT DOCUMENTS

| | | | |
|---|---|---|---|
| 3,581,198 | 5/1971 | Shoemaker et al. | 330/2 X |
| 4,042,885 | 8/1977 | Rhodes, Jr. | 330/9 |
| 5,499,526 | 3/1996 | Muro | 73/1 D |

OTHER PUBLICATIONS

Document Number 08/423,008 Name Kearney Filing Date (if approp.) Apr. 14, 1995.
Document Number 08/421,761 Name Kearney Filing Date (if approp.) Apr. 14, 1995.
Document Number 08/421,774 Name Kearney Filing Date (if approp.) Apr. 14, 1995.
Document Number 08/421,956 Name Koglin Filing Date (if approp.) Apr. 14, 1995.
Document Number 08/422,227 Name Koglin Filing Date (if approp.) Apr. 14, 1995.
Document Number 08/422,341 Name Kearney Filing Date (if approp.) Apr. 14, 1995.
Document Number 08/422,433 Name Kearney Filing Date (if approp.) Apr. 14, 1995.

*Primary Examiner*—James B. Mullins
*Attorney, Agent, or Firm*—Jimmy L. Funke

[57] ABSTRACT

An amplifier circuit and method of providing diagnostic testing to a Wheatstone bridge amplifier circuit are provided herein. The amplifier circuit includes a balanced circuit such as a Wheatstone bridge employed in a piezoresistive transducer which produces a differential output signal. The amplifier circuit also includes an amplifier having a differential input for amplifying differential input signals. A diagnostic test circuit is coupled between the balanced circuit and the amplifier circuit and includes a pair of resistors with current sources which may be switched in via electronic switches. With the current sources switched in, a known offset voltage is applied across the differential input to the amplifier and the amplifier output is monitored and compared to an initial output signal. By comparing the initial output signal with the test signal, a determination as to the gain and other characteristics of the amplifier circuit can be made.

9 Claims, 3 Drawing Sheets

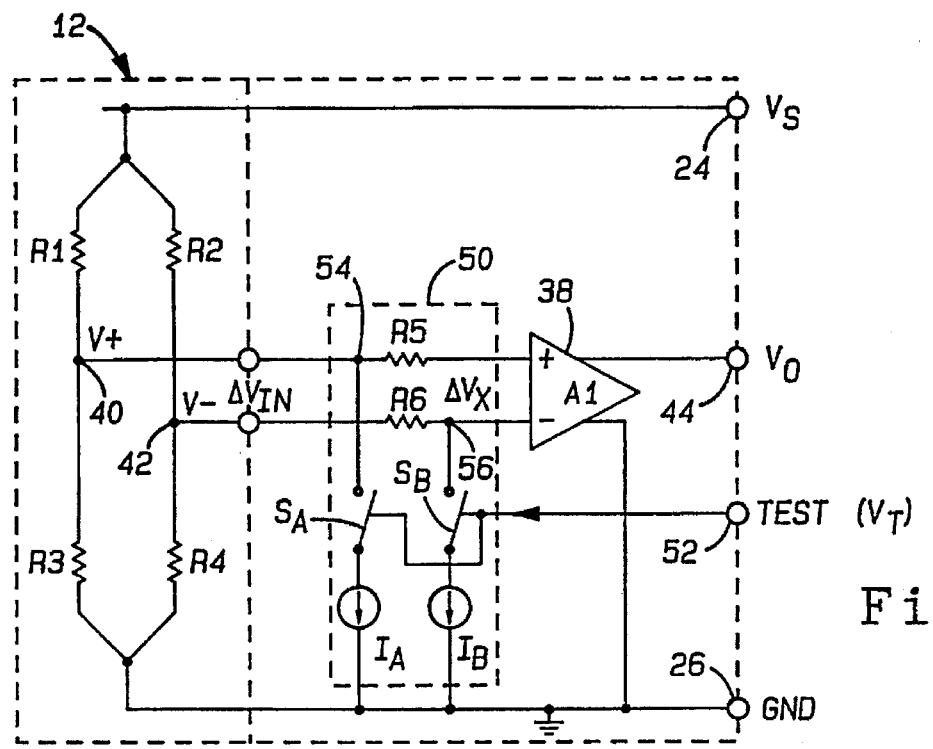
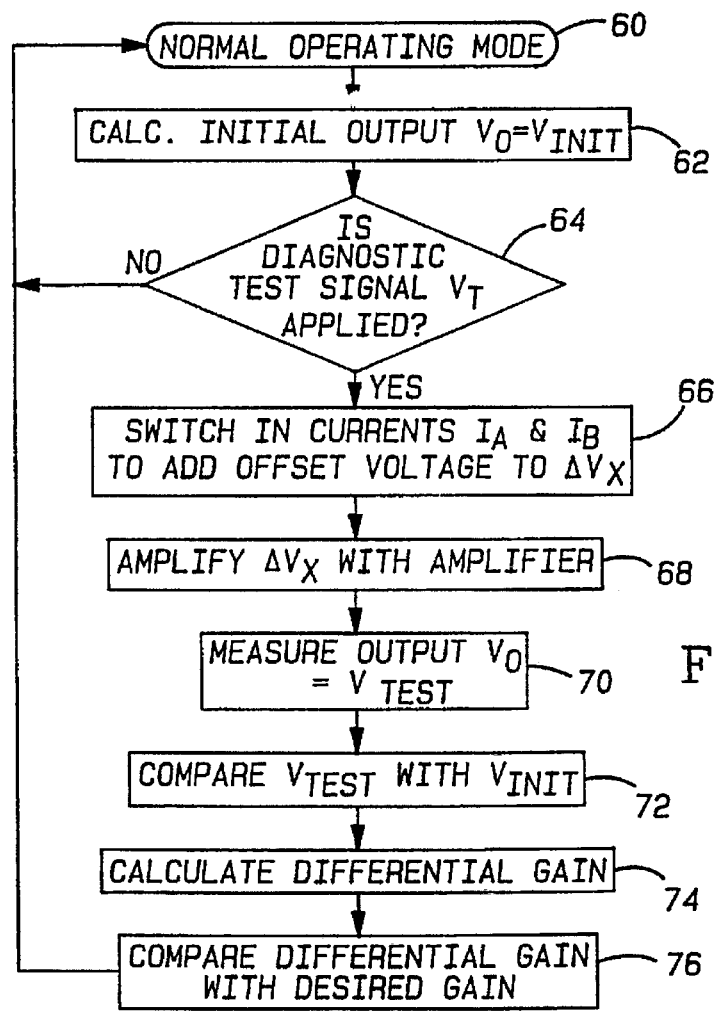
Fig-6
Fig-7

WHEATSTONE BRIDGE AMPLIFIER CIRCUIT WITH INTEGRATED DIAGNOSTIC TESTING

BACKGROUND OF THE INVENTION

1. Technical Field

This invention relates generally to amplifiers and, more particularly, to a Wheatstone bridge transducer amplifier circuit having integrated diagnostic testing circuitry for testing the amplifier circuit.

2. Discussion

Transducers are widely used to generate an electrical signal in response to a physical stimulus. For example, transducers can be designed to sense an amount of force due to pressure or motion/acceleration. Piezoresistive transducers are conventionally configured with strain sensing circuit elements fabricated on a semiconductor chip. Generally speaking, the strain sensing circuit is commonly configured as a Wheatstone bridge which is generally made up of four balanced resistors. Under balanced conditions, the Wheatstone bridge strain sensing circuit preferably exhibits equal value resistance with the resistor configuration and produces a zero differential voltage output. However, when subjected to an amount of strain caused by a physical stimulus, the resistive characteristics of the Wheatstone bridge change, thereby resulting in an unbalanced condition. At the same time, a measurable differential output voltage is produced across the differential outputs. The measured differential output is generally proportional to the physical stimulus being measured.

Since Wheatstone bridge transducers generally produce very small differential output signals, the differential output signals usually require amplification and signal compensation in order to provide output signals at useable amplitudes. The necessary amplification is usually accomplished with a specialized transducer amplifier. Additionally, it is often desirable to include the amplification circuitry in the same assembled mechanical package of the Wheatstone bridge strain sensing circuit so as to realize improved performance and lower cost. Furthermore, it is often necessary to test the characteristics of a transducer and amplifier circuit over time and use of the transducer circuit. This is because characteristics of the amplifier such as gain and offset are susceptible to change over time and use as should be evident to one skilled in the art. For example, a piezoresistive accelerometer transducer is preferably periodically tested when used in connection with automotive airbag applications. This is to ensure that the transducer is currently operating properly and that the amplifier is realizing the proper gain.

Once the transducer and amplifier are fully assembled in the mechanical package, diagnostic testing of the transducer and amplifier generally becomes much more complicated and very difficult to properly perform. This is because it is usually difficult or impracticable to adequately separate the Wheatstone bridge sensing circuit from the amplification circuitry to perform the necessary diagnostic testing. Also, with the assembled package it may not be possible to provide adequate physical stimulation to the Wheatstone bridge transducer as is often required to verify proper amplifier performance.

It is therefore desirable to provide a transducer amplifier circuit which may easily undergo diagnostic testing to ensure proper operation of the transducer and amplification circuitry.

More particularly, it is desirable to provide a balanced transducer amplifier circuit with an integrated diagnostic testing circuit which may receive a diagnostic test input signal and test the amplifier circuit in a diagnostic mode without affecting the normal operation of the amplifier circuit.

It is further desirable to provide a diagnostic test circuit which adds minimal circuitry for use with a Wheatstone bridge transducer coupled to a differential amplifier.

Yet, it is also desirable to provide for a method of applying a diagnostic test input signal to a differential input Wheatstone bridge amplifier to perform diagnostic testing of the amplifier circuit.

SUMMARY OF THE INVENTION

In accordance with the teachings of the present invention, an amplifier circuit is provided with an integrated diagnostic testing circuit. The amplifier circuit includes a balanced circuit such as a Wheatstone bridge circuit associated with a piezoresistive transducer which provides a differential output. An amplifier is included which has a differential input for amplifying differential input signals. The amplifier circuit also has a diagnostic test circuit coupled between the balanced circuit and the amplifier. The diagnostic test circuit has a test input for receiving a diagnostic testing signal which activates a diagnostic testing mode. When the diagnostic test mode is activated, the diagnostic testing circuit applies an offset voltage to the differential input of the amplifier. An amplifier output voltage which is measured during normal amplifier operations is then compared to the amplifier output voltage measured in a diagnostic testing mode. From the comparison, an indication of the operating characteristics such as gain of the amplifier circuit can be achieved.

BRIEF DESCRIPTION OF THE DRAWINGS

Other objects and advantages of the present invention will become apparent to those skilled in the art upon reading the following detailed description and upon reference to the drawings in which:

FIG. 6 is a circuit diagram illustrating the strain sensing circuit and amplifier of FIG. 4 with a diagnostic test circuit in accordance with the present invention; and FIG. 7 is a flow diagram illustrating the methodology of performing diagnostic testing of the Wheatstone bridge transducer and amplifier circuit in accordance with the present invention.

DETAILED DESCRIPTION OF THE PREFERRED EMBODIMENTS

Figure 1:
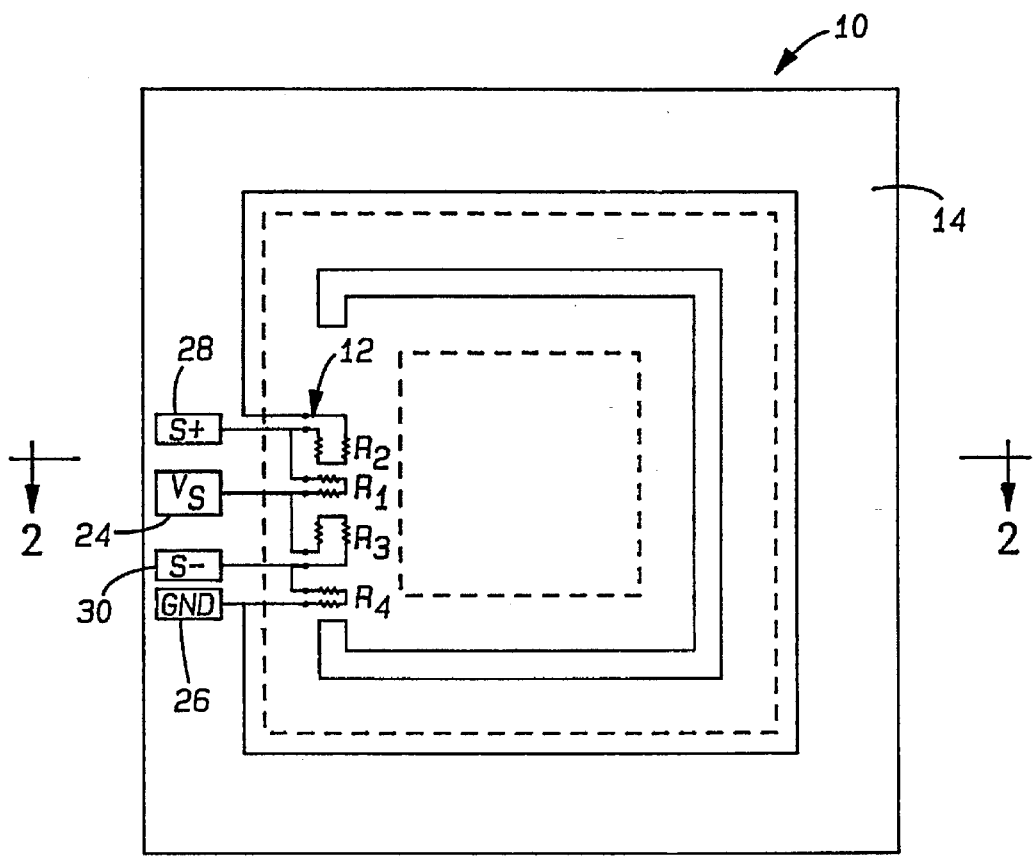
FIG. 1 is a schematic view of a piezoresistive motion/accelerometer transducer which may be used in connection with the present invention.
Figure 2:
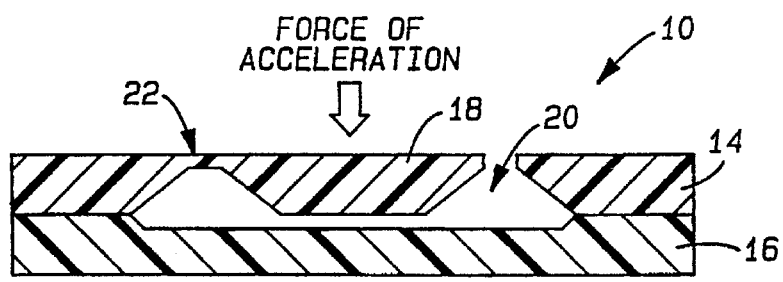
FIG. 2 is a cross-sectional view of the piezoresistive motion/accelerometer transducer taken through line 2—2 of FIG. 1.

Turning now to FIGS. 1 and 2, a piezoresistive accelerometer transducer 10 is shown which may be used in connection with the present invention. The piezoresistive accelerometer transducer 10 has a strain sensing circuit 12 fabricated on a flexible material 14 such as silicon which in turn is fabricated on top of a rigid support substrate 16. As is common with an accelerometer transducer such as transducer 10, a force of acceleration is measured by the strain sensing circuit 12 at a strain measuring location 22. When subjected to acceleration, a proportional amount of force is generally applied to member 18. In turn, this causes member 18 to flex about and cause strain at location 22 of flexible material 14 as member 18 is forced into cavity 20. This in turn changes the resistive properties of the strain sensing circuit 12 which is measured therewith. The amount of strain detected with the strain detection circuit 12 is proportional to the amount of physical stimulus applied thereto. For an accelerometer, the strain detected is typically proportional to the force of acceleration subjected thereto.

While a piezoresistive accelerometer transducer 10 is shown and described in connection with FIGS. 1 and 2, it should be appreciated that the present invention is likewise applicable to various other transducers which detect physical stimulus with a balanced sensing circuit. For example, a piezoresistive pressure transducer may be used for sensing an amount of force due to a pressure differential. Piezoresistive accelerometer and pressure transducers commonly employ the Wheatstone bridge strain sensing circuit as shown and described in connection with the present invention.

Figure 3:
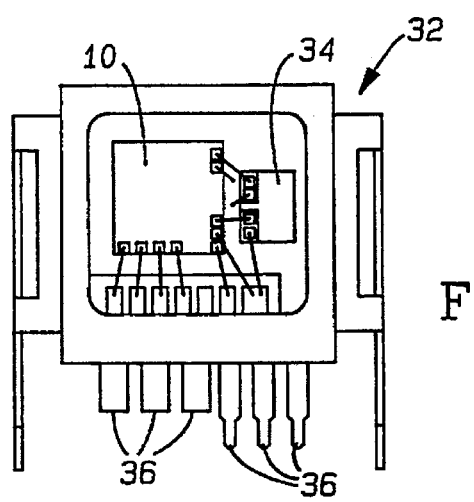
FIG. 3 is a top view of a packaged electronic sensing module containing a piezoresistive transducer and amplifier circuit according to one application.

Referring to FIG. 3, a fully packaged electronic sensing module 32 is shown including the piezoresistive transducer 10 and an integrated amplifier circuit and conditioning chip 34. The integrated amplifier circuit and conditioning chip 34 and transducer 10 are electrically coupled to one another and further coupled to a plurality of standard input and output connectors 36. Briefly, the input/output connectors 36 may include addressing decoder inputs, inputs for receiving supply voltage $V_s$ and ground reference, a programming voltage input, and an output for outputting an output voltage $V_o$. The sensing module 32 when fully packaged is completely enclosed and preferably sealed from the outside environment. Accordingly, physical access to the internal components is difficult or impracticable. This makes diagnostic testing of the conventional transducer and amplifier circuit difficult and may require special testing techniques once the components 32 are fully packaged in module 32. The present invention addresses this problem and provides a diagnostic testing circuit and method which allows for diagnostic testing of the transducer 10 and amplifier circuit 34 without requiring physical access to internal components.

Figure 4:
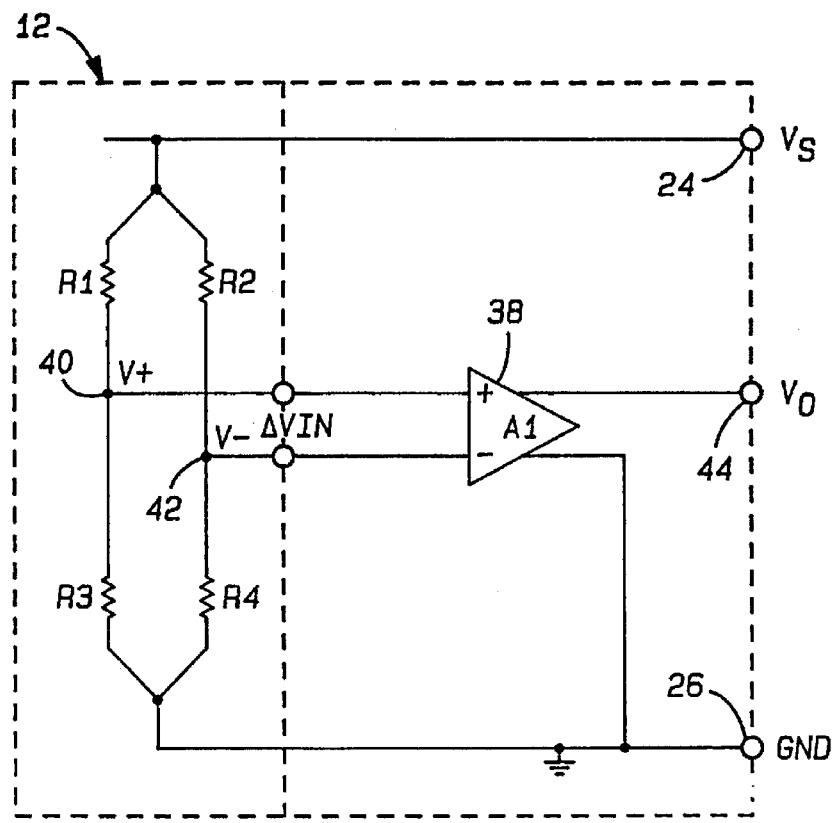
FIG. 4 is a circuit diagram illustrating a Wheatstone bridge strain sensing circuit coupled to a differential amplifier.

Referring to FIG. 4, the strain sensing circuit 12 is shown in an electrically equivalent form connected to a differential amplifier 38. More particularly, the strain sensing circuit 12 is configured as a Wheatstone bridge generally made up of four resistors R1 through R4. As previously mentioned, under balanced conditions the Wheatstone bridge preferably exhibits equal value resistance with resistors R1 through R4 and produces a differential voltage output $\Delta V_{IN}$, which is the difference between voltages V+ and V−, equal to zero. However, when subjected to an amount of strain, the resistive characteristics of the Wheatstone bridge change, thereby resulting in an unbalanced condition. At the same time, a measurable differential output voltage $\Delta V_{IN}$ defined by the difference between voltages V+ to V−, is produced at nodes 40 and 42. The differential output voltage $\Delta V_{IN}$ is generally proportional to an amount of physical stimulus sensed by the transducer 10.

Figure 5:
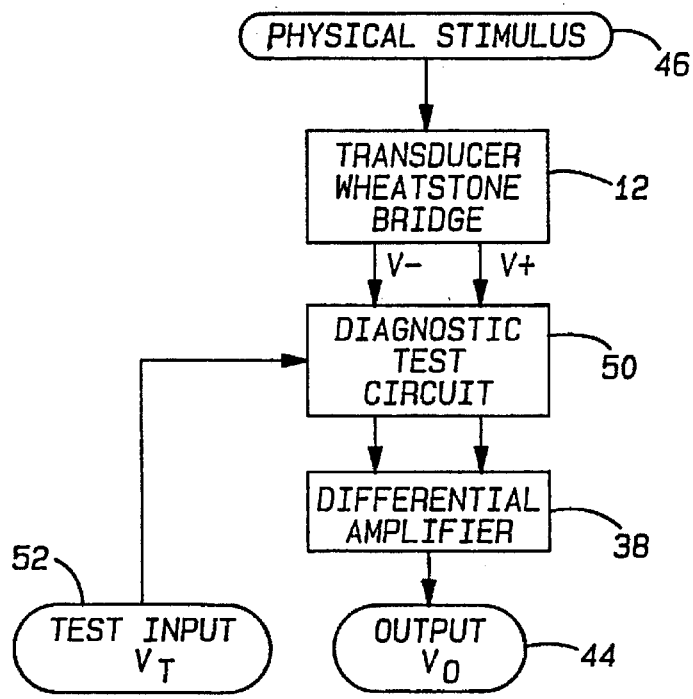
FIG. 5 is a block diagram illustrating the use of a diagnostic test circuit in accordance with the present invention.

According to the present invention, a diagnostic test circuit 50 is coupled between the transducer Wheatstone bridge 12 and the differential amplifier 38 as illustrated in FIGS. 5 and 6. The diagnostic test circuit 50 receives the Wheatstone bridge differential outputs V+ and V−, also referred to as $\Delta V_{IN}$, and adds an offset voltage to the amplifier input $\Delta V_X$ when a diagnostic testing mode is activated. The diagnostic test circuit 50 also receives a diagnostic test input $V_T$ 52 which activates or deactivates the diagnostic testing mode. According to one embodiment, a logic "high" voltage signal on test input $V_T$ 52 activates the diagnostic testing mode of operation, while a logic "low" voltage signal on test input $V_T$ 52 allows for normal transducer and amplifier operations. However, opposite logic states for activating and deactivating the diagnostic testing mode may alternatively be used.

With particular reference to FIG. 6, the diagnostic test circuit 50 is shown made up of a pair of resistors R5 and R6, a pair of cooperative electronic switches $S_A$ and $S_B$ and corresponding current sources $I_A$ and $I_B$. More specifically, resistor R5 is coupled in series between node 40 of the Wheatstone bridge circuit 12 and the non-inverting input (+) of differential amplifier 38. Similarly, resistor R6 is coupled in series between node 42 of the Wheatstone bridge circuit 12 and the inverting input (−) of differential amplifier 38. The resistors R5 and R6 are preferably of equal resistance and do not affect normal operation of the amplifier circuit. Similarly, currents $I_A$ and $_B$ are substantially equal. Equal value resistors R5 and R6 and equal value currents $I_A$ and $I_B$ provide for a matched diagnostic test circuit 50. Furthermore, a node 54 is shown between resistor R5 and node 40, while another node 56 is shown between resistor R6 and the inverting input (−) of the differential amplifier 38.

Electronic switch $S_A$ is connected in series with current source $I_A$ between node 54 and ground. Similarly, electronic switch $S_B$ is connected in series with current source $I_B$ between node 56 and ground. Test input voltage $V_T$ is applied as a control signal to control both switches $S_A$ and $S_B$. During normal amplifier circuit operations, test input $V_T$ is set to a logic "low" voltage signal which maintains switches $S_A$ and $S_B$ in a normally open position. This prevents current sources $I_A$ and $I_B$ from producing any offset voltage. However, when test input $V_T$ changes to a "high" logic voltage signal, switches $S_A$ and $S_B$ are closed so as to switch on current sources $I_A$ and $I_B$. In effect, switching on current sources $I_A$ and $I_B$ produces a known offset voltage which is applied and added to the differential input voltage $\Delta V_X$ of the differential amplifier 38. This additional offset voltage essentially adds to any differential input voltage $\Delta V_{IN}$ as received from the Wheatstone bridge circuit 12 to provide the differential input voltage $\Delta V_X$. The additional offset voltage that is added to the input of the differential amplifier 38 is caused by current $I_B$ flowing through resistor R6. Accordingly, the differential voltage $\Delta V_X$ appearing at the inputs of the differential amplifier 38 can be calculated as provided in the following equation:

$$\Delta V_X = \Delta V_{IN} + (I_B * R_6).$$

The aforementioned equation for the differential voltage $\Delta V_X$ is generally based on the assumption of equal value currents $I_A$ and $I_B$ and equal valued resistors R5 and R6. The use of equal value currents $I_A$ and $I_B$ and equal value resistors R5 and R6 allows for achievement of a known offset voltage without having to calculate the overall resistance in the transducer and amplifier circuit. Accordingly, current sources $I_A$ and $I_B$ are preferably set equal to each other and, resistors R5 and R6 are substantially of equal value. If the amplifier circuit is functioning correctly within its capable operating range, the offset voltage or change in amplifier input voltage induced by activating the diagnostic test mode will cause a corresponding change in the output voltage $V_O$. To test the operating characteristics of the amplifier, the measured output voltage $V_O$ is preferably measured during the normal operating mode and again during the diagnostic testing mode. The measured output voltages $V_O$ are stored in memory and the gain of the amplifier is calculated and verified in accordance with the present invention.

The methodology for performing diagnostic testing of the amplifier circuit in accordance with the present invention is illustrated in FIG. 7. Beginning at step 60, with the normal operating mode, the differential amplifier 38 amplifies the differential input voltage $\_V_X$ as received from the Wheatstone bridge circuit 12. At the same time, according to step 62, the initial output signal $V_O$ is measured and identified as initial value $V_{INIT}$. Proceeding to step 64, the diagnostic test input signal $V_T$ is checked for application. If the diagnostic test input signal $V_T$ is not applied, the normal amplifier operating mode is maintained according to step 60. Otherwise, if the diagnostic test input signal $V_T$ is applied, the diagnostic testing routine is activated as shown in step 66.

With the diagnostic testing mode activated, current sources $I_A$ and $I_B$ are switched on via switches $S_A$ and $S_B$ to produce the known offset voltage that is added to the differential input of the differential amplifier 38. With the use of differential amplifier 38, the differential input $\Delta V_X$ is amplified as provided in step 68. Proceeding to step 70, the amplifier output $V_O$ is measured a second time and is referred to as test value $V_{TEST}$. The methodology then proceeds to step 72 to compare the test value output $V_{TEST}$ with the initial output value $V_{INIT}$. Assuming the Wheatstone bridge differential output voltage $\Delta V_{IN}$ has not changed between the two measurements, the gain of the differential amplifier may then be calculated pursuant to step 74. The gain of the differential amplifier may be calculated as follows:

$$\text{GAIN} = \frac{\Delta V_o}{(\Delta V_X - \Delta V_{IN})} = \frac{(\Delta V_{TEST} - \Delta V_{INIT})}{(I_B * R_6)}$$

If it is assumed that the quantity of current $I_B$ multiplied by resistor R6 is fixed by design, the calculated differential gain of the amplifier can be compared against the desired gain to verify proper operation. The calculated differential gain is compared with the desired gain pursuant to step 76 to determine whether the gain characteristics of the amplifier circuit are functioning properly. This enables verification of a properly operating amplifier circuit, without requiring physical access to internal components. Once the diagnostic testing mode of operation is complete, the methodology returns to the normal operating mode as provided in step 60.

Accordingly, the integrated diagnostic testing of the present invention allows for easy testing of the amplifier circuit, even despite a sealed packaging assembly. While the gain of the amplifier may be tested, it should be appreciated that the diagnostic testing may achieve testing of other amplifier characteristics, as well as operating characteristics of the transducer and other circuit components.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

What is claimed is:

1. An amplifier circuit with integrated diagnostic testing, said amplifier circuit comprising:
   a balanced circuit for providing a differential output;
   an amplifier having a first input and a second input to provide a differential input for receiving and amplifying a differential input signal;
   a diagnostic test circuit coupled to the amplifier and balanced circuit, said diagnostic test circuit applying an offset voltage to the differential input of the amplifier when in a diagnostic testing mode, said diagnostic test circuit including a first resistor connected in series to the first input of the amplifier and a second resistor connected in series to the second input of the amplifier, wherein the first and second resistors provide substantially equal resistance;
   a test input coupled to the diagnostic test circuit for receiving a test signal for activating the diagnostic testing mode; and
   an output coupled to the amplifier output for providing an amplified output signal.

2. The amplifier circuit as defined in claim 1 further comprising first and second current sources coupled to the first and second resistors, respectively, for inducing an offset voltage across the differential input of the amplifier when in the diagnostic testing mode.

3. The amplifier circuit as defined in claim 2 further comprising a first switch coupled to the first current source and a second switch coupled to the second current source, said first and second switches being controlled so as to switch in or out the respective current sources when in the diagnostic testing mode.

4. The amplifier circuit as defined in claim 2 wherein said first and second current sources provide substantially equal current.

5. The amplifier circuit as defined in claim 1 wherein said balanced circuit comprises a Wheatstone bridge.

6. The amplifier circuit as defined in claim 5 wherein said Wheatstone bridge is used in a piezoresistive transducer.

7. A piezoresistive transducer with amplifier circuitry and diagnostic testing capability, said piezoresistive transducer comprising:
   a balanced sensing circuit for producing a differential output signal in response to a physical stimulus;
   an amplifier circuit including a differential amplifier having a first input and a second input to provide a differential input for amplifying differential input signals;
   a diagnostic test circuit coupled between the balanced circuit and the amplifier circuit, said diagnostic test circuit having a test input for receiving a test signal for activating a diagnostic testing mode, said diagnostic test circuit being operative to apply an offset voltage to the differential input of the amplifier circuit when in the diagnostic testing mode, said diagnostic test circuit including a first resistor connected in series to the first input of the differential amplifier and also coupled to a first current source, said diagnostic test circuit including a second resistor connected in series to the second input of the differential amplifier and also coupled to a second current source, wherein the first and second resistors have substantially equal resistance so as to provide a balanced transducer circuit; and
   an output coupled to the amplifier for providing an amplified output signal.

8. The transducer as defined in claim 7 wherein said transducer is substantially integrated in a sealed mechanical housing and said diagnostic testing is performed without requiring physical access to internal components within the housing.

9. A method of performing diagnostic testing of a wheatstone bridge amplifier circuit, said method comprising the steps of:

providing a differential input signal that is produced by a balanced circuit to first and second inputs of a differential amplifier;

amplifying the differential input signal to produce an initial output signal;

applying a known offset voltage to the differential input signal across the first and second inputs of the differential amplifier by applying a current signal to a resistor that is coupled in series to the first input of the differential amplifier and applying a second current source between a second resistor and the second input of the differential amplifier, wherein the first and second resistors have substantially equal resistance and the first and second current sources provides substantially equal current;

amplifying the differential input signal with an amplifier when the offset voltage is applied to produce a test output signal; and comparing the initial output signal to the output test signal so as to test characteristics of the amplifier circuit.

* * * * *